(12) United States Patent
Yan et al.

(10) Patent No.: US 12,107,066 B2
(45) Date of Patent: Oct. 1, 2024

(54) ELECTRONIC DEVICE

(71) Applicant: InnoLux Corporation, Miao-Li County (TW)

(72) Inventors: Tzu-Min Yan, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/317,145

(22) Filed: May 15, 2023

(65) Prior Publication Data

US 2023/0282606 A1    Sep. 7, 2023

Related U.S. Application Data

(62) Division of application No. 16/802,806, filed on Feb. 27, 2020, now Pat. No. 11,688,710.

(Continued)

(30) Foreign Application Priority Data

Nov. 14, 2019   (CN) .......................... 201911110966.X

(51) Int. Cl.
*H01L 23/00*   (2006.01)
*H01L 25/075*   (2006.01)
(Continued)

(52) U.S. Cl.
CPC .............. *H01L 24/31* (2013.01); *H01L 24/15* (2013.01); *H01L 24/16* (2013.01); *H01L 24/17* (2013.01); *H01L 24/32* (2013.01); *H01L 24/33* (2013.01); *H01L 25/0753* (2013.01); *H01L 33/36* (2013.01); *H01L 33/62* (2013.01); *H01L 25/167* (2013.01)

(58) Field of Classification Search
None
See application file for complete search history.

(56) References Cited

U.S. PATENT DOCUMENTS

| | | | |
|---|---|---|---|
| 2014/0312368 A1* | 10/2014 | Lee ........................ | H01L 27/156 257/89 |
| 2015/0125980 A1* | 5/2015 | Kurihara ............. | H01L 33/0075 438/45 |

(Continued)

*Primary Examiner* — Feifei Yeung Lopez
(74) *Attorney, Agent, or Firm* — McClure, Qualey & Rodack, LLP

(57) ABSTRACT

An electronic device is provided. The electronic device includes a substrate and another substrate disposed opposite to the substrate. The electronic device includes a first light-emitting element disposed on the substrate and configured to emit blue light under a first current density when the substrate provides a first current to the first light-emitting element. The electronic device includes a second light-emitting element disposed on the substrate and configured to emit green light or red light under a second current density when the substrate provides a second current to the second light-emitting element. The electronic device includes a protective layer disposed between the substrate and the another substrate and covering the first light-emitting element and the second light-emitting element. The electronic device includes an adhesive layer disposed between the protective layer and the another substrate.

7 Claims, 7 Drawing Sheets

Related U.S. Application Data

(60) Provisional application No. 62/823,052, filed on Mar. 25, 2019.

(51) Int. Cl.
*H01L 33/36* (2010.01)
*H01L 33/62* (2010.01)
*H01L 25/16* (2023.01)

(56) References Cited

U.S. PATENT DOCUMENTS

2015/0255680 A1* 9/2015 Matsumura ............. H01L 33/10
 257/94
2020/0357846 A1* 11/2020 Lee ..................... H01L 25/0655

* cited by examiner

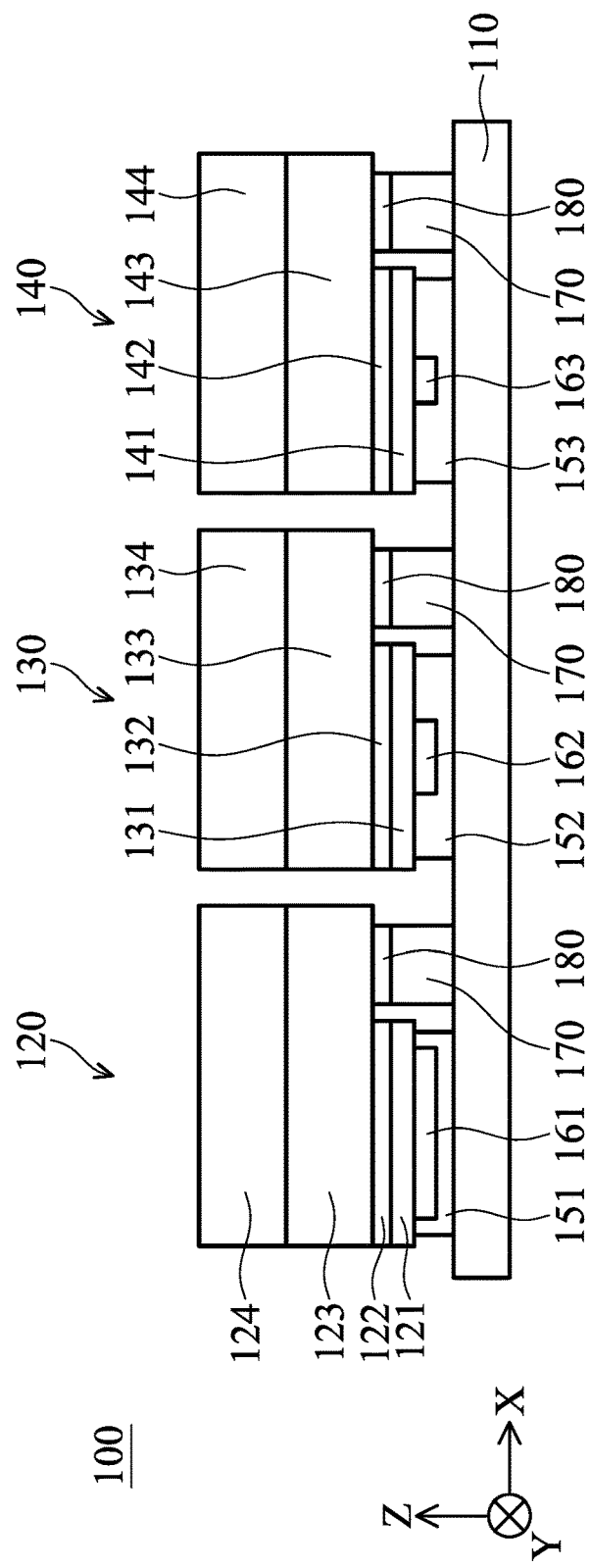

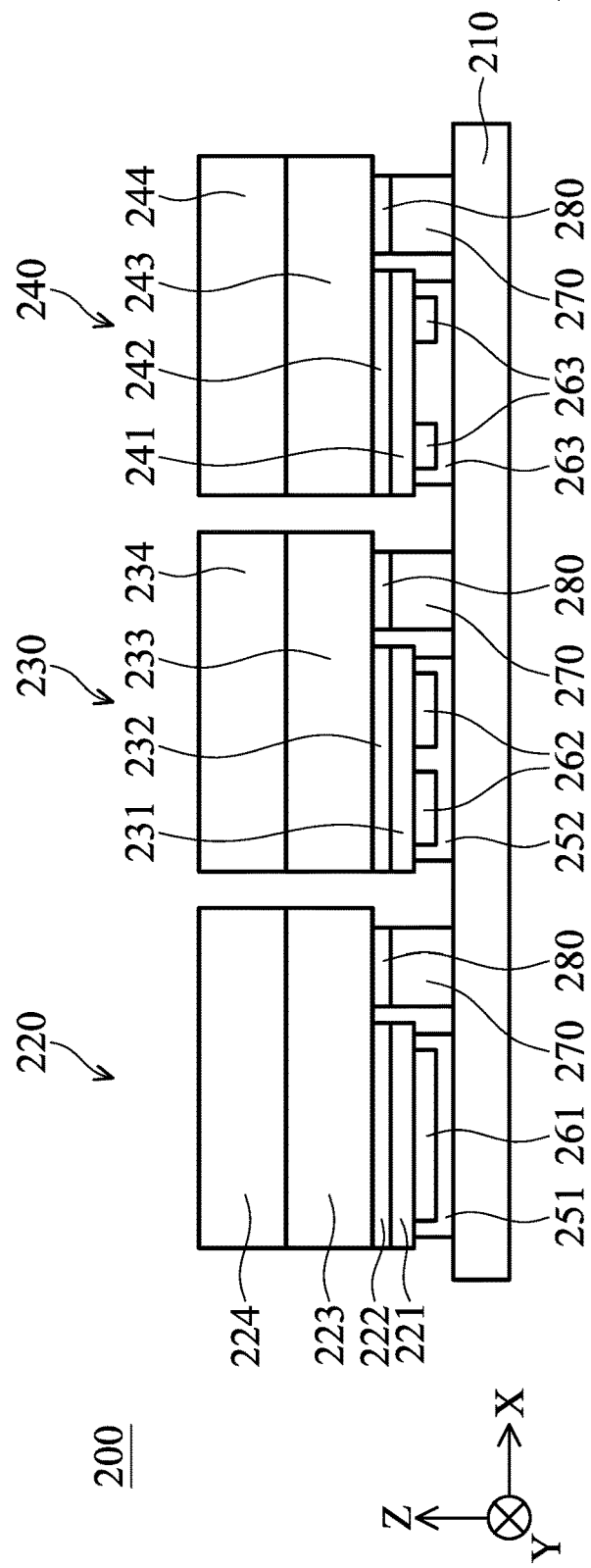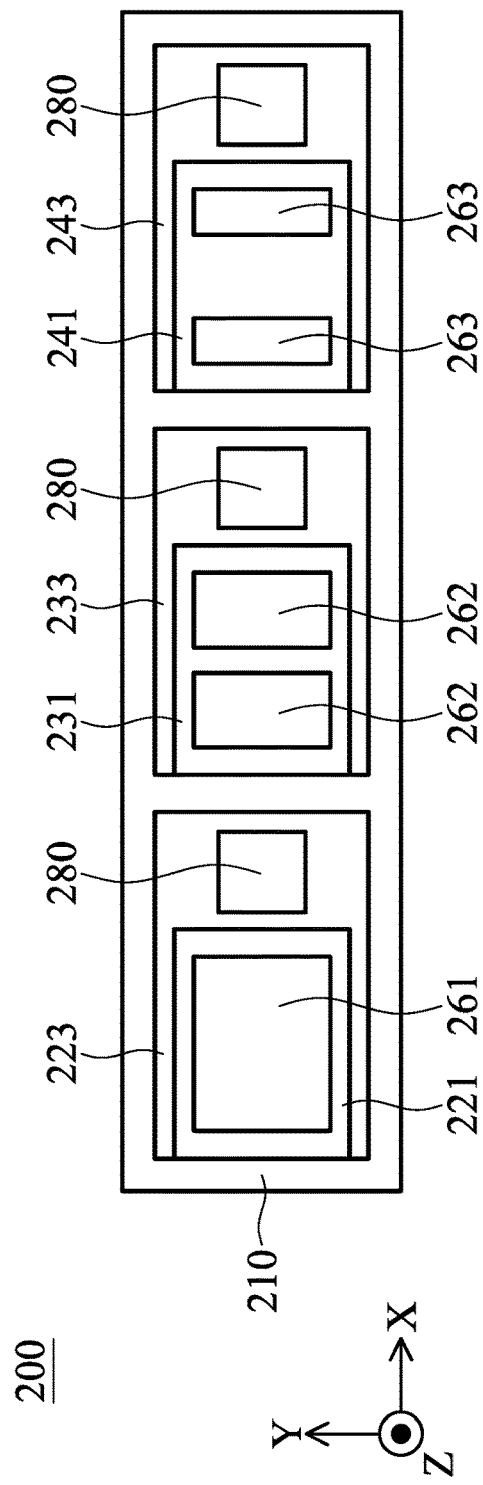

ELECTRONIC DEVICE

CROSS REFERENCE TO RELATED APPLICATIONS

This application is a Divisional of U.S. patent application Ser. No. 16/802,806, filed Feb. 27, 2020 and entitled "ELECTRONIC DEVICE" (now U.S. Pat. No. 11,688,710), which claims the benefit of U.S. Provisional Application No. 62/823,052 filed on Mar. 25, 2019, and claims priority of China Patent Application No. 201911110966.X, filed Nov. 14, 2019, the entirety of which is incorporated by reference herein.

BACKGROUND

Field of the Invention

The present invention relates to an electronic device, and in particular to an electronic device having ohmic contact electrodes with different sizes.

Description of the Related Art

Currently, light-emitting diode (LED) chips with different sizes or different driving currents are usually used to achieve white color balance. However, the process of manufacturing or activating LEDs may be complicated by the above arrangement. Therefore, how to solve the aforementioned problem has become an important topic.

BRIEF SUMMARY

Some embodiments of the disclosure provide an electronic device, including: a substrate and another substrate disposed opposite to the substrate. The electronic device includes a first light-emitting element disposed on the substrate and configured to emit blue light under a first current density when the substrate provides a first current to the first light-emitting element. The first light-emitting element includes a first semiconductor layer, a first ohmic contact electrode and a first conductive pad. The electronic device includes a second light-emitting element disposed on the substrate and configured to emit green light or red light under a second current density when the substrate provides a second current to the second light-emitting element. The second light-emitting element includes a second ohmic contact electrode and a second conductive pad disposed between the substrate and the second ohmic contact electrode. The electronic device includes a protective layer disposed between the substrate and the another substrate and covering the first light-emitting element and the second light-emitting element. The electronic device includes an adhesive layer disposed between the protective layer and the another substrate. The first current is equal to the second current, and the first current density is less than the second current density. The second ohmic contact electrode is divided into a plurality of separate portions, and the second conductive pad is in contact with sidewalls of the plurality of separate portions.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 1 is a cross-sectional view illustrating an electronic device in accordance with some embodiments of the present disclosure.

FIG. 2 is a top view illustrating the electronic device shown in FIG. 1.

FIG. 3 is a cross-sectional view illustrating the electronic device in accordance with some embodiments of the present disclosure.

FIG. 4 is a top view illustrating the electronic device shown in FIG. 3.

DETAILED DESCRIPTION OF THE INVENTION

Figure 5:
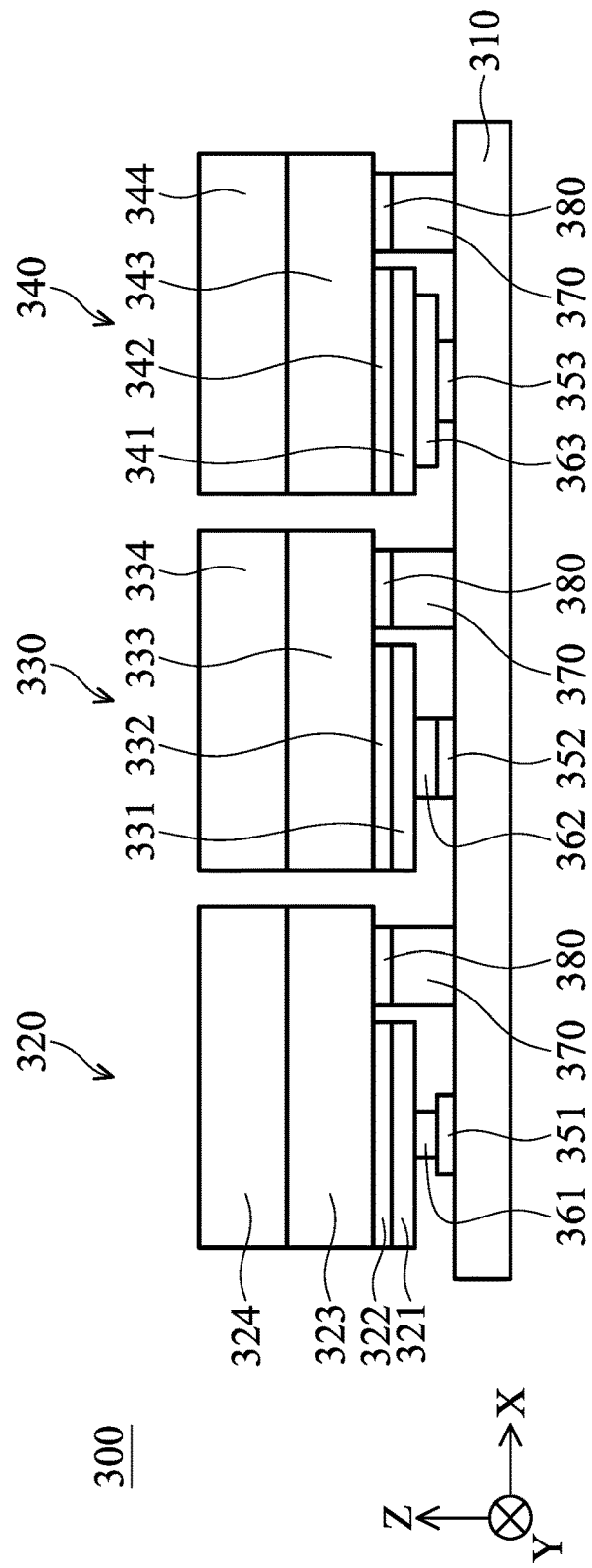
FIG. 5 is a cross-sectional view illustrating the electronic device in accordance with some embodiments of the present disclosure.

The electronic devices of some embodiments of the present disclosure are described in the following description. The specific embodiments disclosed are provided merely to clearly describe the usage of the present disclosure by some specific methods without limiting the scope of the present disclosure.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

It should be understood that, although the terms "first", "second," "third" etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure. In addition, for the sake of clarity, the terms "first", "second," "third" etc. may not be used in the specification to distinguish different elements. The first element, the second element and/or the third element recited in the claims may be referred to any element that conforms to the description in the specification.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the term "substrate" in the following paragraphs may include elements formed on the substrate or various layers covering the substrate, such as any active component (e.g. transistor) that is formed thereon as required. However, in order to simplify the figures herein, it is shown as a plane substrate.

FIG. 1 is a cross-sectional view illustrating an electronic device 100 in accordance with some embodiments of the present disclosure. It should be noted that the electronic device 100 may include a display device, an antenna device, a sensing device or a tiled device, but is not limited thereto. The electronic device may be a bendable or flexible electronic device. The electronic device may include, for example, a liquid-crystal light-emitting diode, and the light-emitting diode may include, for example, an organic light-emitting diode (OLED), a mini LED, a micro LED or quantum dot (QD) light-emitting diode (which may be referred to as QLED, QDLED), fluorescence, phosphor, or other suitable materials, and the materials can be arranged and combined arbitrarily, but the present disclosure is not limited thereto. The antenna device may be, for example, a liquid-crystal antenna, but it is not limited thereto. The tiled device may be, for example, a display tiled device or an antenna tiled device, but it is not limited thereto. It should be noted that the electronic device 100 may be any of the aforementioned arrangement but is not limited thereto.

As shown in FIG. 1, the electronic device 100 includes a substrate 110 and a plurality of light-emitting elements (including a first light-emitting element 120, a second light-emitting element 130 and a third light-emitting element 140) that are disposed on the substrate 110. It should be understood that although three light-emitting elements are shown in this embodiment, those skilled in the art may arbitrarily adjust the number of light-emitting elements as required. In this embodiment, the substrate may supply the same current to the first light-emitting element 120, the second light-emitting element 130, and the third light-emitting element 140, the first light-emitting element 120, the second light-emitting element 130 and the third light-emitting element 140 emit colored light. For example, the first light-emitting element 120, the second light-emitting element 130 and the third light-emitting element 140 each include a blue LED. A light-transmitting layer 124 is disposed on the first light-emitting element 120, a color conversion layer 134 is disposed on the second light-emitting element 130, and a color conversion layer 144 is disposed on the third light-emitting element 140, the first light-emitting element 120, the second light-emitting element 130 and the third light-emitting element 140 emit different colors of light. In other embodiments, the first light-emitting element 120 includes a blue LED, the second light-emitting element 130 includes a green LED, and the third light-emitting element 140 includes a red LED. In other embodiments, at least one of the first light-emitting element 120, the second light-emitting element 130 and the third light-emitting element 140 includes an ultraviolet light-emitting diode (UV LED), but the present disclosure is not limited thereto.

Referring to FIG. 1, the first light-emitting element 120 includes a semiconductor layer 121, a light-emitting layer 122, a semiconductor layer 123, and a light-transmitting layer 124. In this embodiment, the semiconductor layer 121 and the semiconductor layer 123 may include gallium nitride (GaN) or any other suitable semiconductor materials, but they are not limited thereto. In some embodiments, the semiconductor layer 121 and the semiconductor layer 123 may include different types of semiconductor materials. For example, the semiconductor layer 121 may be a p-type semiconductor layer, the semiconductor layer 123 may be an n-type semiconductor layer, but they are not limited thereto. The light-emitting layer 122 is disposed between the semiconductor layer 121 and the semiconductor layer 123. The light-emitting layer 122 may include, a homojunction, a heterojunction, a single-quantum well (SQW), a multiple-quantum well (MQW), any other suitable structure or a combination thereof, but it is not limited thereto. The light-emitting layer 122 may emit blue light, but it is not limited thereto. In this embodiment, the light-transmitting layer 124 is disposed on the semiconductor layer 123, the light emitted by the light-emitting layer 122 may be irradiated to the outside through the light-transmitting layer 124.

The semiconductor layer 121 may be connected to and/or electrically connected to the substrate 110 through an ohmic contact electrode 161 and a conductive pad 151. In this embodiment, the conductive pad 151 and the semiconductor layer 121 may completely cover the ohmic contact electrode 161. In other words, the conductive pad 151 may be in contact with the semiconductor layer 121, and the first light-emitting element 120 may be disposed on the substrate 110 more stably. For example, the ohmic contact electrode 161 may include indium tin oxide (ITO), silver (Ag), nickel (Ni), gold (Au), platinum (Pt), gold beryllium alloy (AuBe), gold germanium Alloy (AuGe), chromium (Cr) or any other suitable conductive material.

In addition, the second light-emitting element 130 may have a structure similar to the first light-emitting element 120. For example, the second light-emitting element 130 includes a semiconductor layer 131, a light-emitting layer 132, a semiconductor layer 133, and a color conversion layer 134. In this embodiment, the light-emitting layer 132 disposed between the semiconductor layer 131 and the semiconductor layer 133 emits blue light, the color conversion layer 134 is disposed on the semiconductor layer 133 to convert the blue light into green light or red light. Similarly, the semiconductor layer 131 may be connected to and/or electrically connected to the substrate 110 through an ohmic contact electrode 162 and a conductive pad 152. The third light-emitting element 140 may have a structure similar to the second light-emitting element 130. For example, the third light-emitting element 140 includes a semiconductor layer 141, a light-emitting layer 142, a semiconductor layer 143 and/or a color conversion layer 144. In this embodiment, the color conversion layer 144 may convert blue light into the other of green light or red light (which is different from the light converted by the color conversion layer 134). Similarly, the semiconductor layer 141 may be connected to and/or electrically connected to the substrate 110 through an ohmic contact electrode 163 and a conductive pad 153.

In addition, in this embodiment, the semiconductor layer 123, the semiconductor layer 133 and the semiconductor layer 143 may be connected to and/or electrically connected to the substrate 110 through an ohmic contact electrode 180 and a conductive pad 170. In some embodiments, the dimensions of the ohmic contact electrode 180 and the conductive pad 170 in the horizontal direction (the X-Y plane) are substantially the same, but they are not limited thereto. In other embodiments, the dimensions of the ohmic contact electrode 180 and the conductive pad 170 in the horizontal direction may be different from each other. In addition, in some embodiments, the ohmic contact electrode 180 may be omitted. That is, the conductive pad 170 may be in direct contact with the semiconductor layer 123, the semiconductor layer 133 and the semiconductor layer 143.

FIG. 2 is a top view illustrating the electronic device 100 shown in FIG. 1. When the substrate 110 supplies the same amount of current to the first light-emitting element 120, the second light-emitting element 130 and the third light-emitting element 140, the contact area (which is located on the X-Y plane) of the semiconductor layer and the ohmic contact electrode can affect the current density supplied to the light-emitting element. The contact area between the semiconductor layer and the ohmic contact electrode has a negative correlation with the current density of the light-emitting element. In other words, the larger the contact area between the semiconductor layer and the ohmic contact electrode, the lower the current density of the light-emitting element. In general, the light-emitting elements with higher light-emitting efficiency needs to a lower current density (that is, the area where the ohmic contact electrode is in contact with the semiconductor layer needs to be increased), but it is not limited thereto. The relationship between the light-emitting efficiency of the light-emitting element and the current density will be described in more detail below in accompany with FIG. 12.

For example, in this embodiment, the light-emitting efficiency of the first light-emitting element 120 is greater than the light-emitting efficiency of the second light-emitting element 130, the light-emitting efficiency of the second light-emitting element 130 is greater than the light-emitting efficiency of the third light-emitting element 140. Therefore, the area of the ohmic contact electrode 161 connected to the first light-emitting element 120 on the X-Y plane (contact with the semiconductor layer 121) is larger than the area of the ohmic contact electrode 162 connected to the second light-emitting element 130 on the X-Y plane (contact with the semiconductor layer 131), and is even larger than the area of the ohmic contact electrode 163 that is connected to the third light-emitting element 140 on the X-Y plane (contact with the semiconductor layer 141). As such, the ratio of the area of the ohmic contact electrode 161 to the area of the semiconductor layer 121 is different from the ratio of the area of the ohmic contact electrode 162 to the area of the semiconductor layer 131 and the ratio of the area of the ohmic contact electrode 163 to the area of the semiconductor layer 141. For example, the ratio of the area of the ohmic contact electrode 161 to the area of the semiconductor layer 121 is greater than the ratio of the area of the ohmic contact electrode 162 to the area of the semiconductor layer 131, which is even greater than the ratio of the area of the ohmic contact electrode 163 to the area of the semiconductor layer 141, but it is not limited thereto.

It should be understood that the above relationship between the light-emitting efficiency of the light-emitting element merely serves as an example. In fact, all the light-emitting elements described in the present disclosure may have different light-emitting efficiency from each other, and the aforementioned light-emitting efficiency may have arbitrary combination of magnitude relationships. For example, in some embodiments, the light-emitting efficiency of the first light-emitting element is less than the light-emitting efficiency of the second light-emitting element, and the light-emitting efficiency of the second light-emitting element is less than the light-emitting efficiency of the third light-emitting element. Those skilled in the art may adjust the area of the ohmic contact electrode in response to different combinations of magnitude relationships of light-emitting efficiency based on the embodiments of the present disclosure. Unless defined otherwise, in the following embodiments, the light-emitting efficiency of the first light-emitting element is greater than the light-emitting efficiency of the second light-emitting element, which is further greater than the light-emitting efficiency of the third light-emitting element, and it will not be repeated again.

FIG. 3 is a cross-sectional view illustrating the electronic device 200 in accordance with some embodiments of the present disclosure, and FIG. 4 is a top view illustrating the electronic device 200 shown in FIG. 3. It should be noted that the electronic device 200 may include the same or similar parts as the electronic device 100 shown in FIGS. 1 and 2, and the aforementioned same or similar parts will be labeled with similar numerals. These parts will not be repeated again. For example, the electronic device 200 includes a substrate 210 and a first light-emitting element 220, a second light-emitting element 230, and a third light-emitting element 240 that are disposed on the substrate 210. Semiconductor layers 221, 231, and 241 of the light-emitting elements are connected to the substrate 210 via ohmic contact electrodes 261, 262, 263 and conductive pads 251, 252, 253.

The ohmic contact electrode 262 and the ohmic contact electrode 263 of the electronic device 200 in this embodiment may be divided into a plurality of separate portions. It should be understood that, in this embodiment, the area where the ohmic contact electrode 262 contacts the semiconductor layer 231 is a sum of the areas of all the portions of the ohmic contact electrode 262 on the X-Y plane. Similarly, the area where the ohmic contact electrode 263 contacts the semiconductor layer 241 is a sum of the areas of all the portions of the ohmic contact electrode 263 on the X-Y plane. By designing the ohmic contact electrode 262 and the ohmic contact electrode 263 into a plurality of separate parts, which can increase a flexibility or diversity in design and/or manufacturing.

FIG. 5 is a cross-sectional view illustrating the electronic device in accordance with some embodiments of the present disclosure. It should be noted that the electronic device 300 in this embodiment may include the same or similar parts as the electronic device 100 shown in FIG. 1 and FIG. 2, and the aforementioned same or similar parts will be labeled as similar numerals. These parts will not be described in detail again. For example, the electronic device 300 includes a substrate 310 and a first light-emitting element 320, a second light-emitting element 330 and a third light-emitting element 340 that are disposed on the substrate 310. Semiconductor layers 321, 331 and 341 of the light-emitting elements are connected to the substrate 310 via ohmic contact electrodes 361, 362, 363 and conductive pads 351, 352, 353.

The conductive pad 351, the conductive pad 352 and/or the conductive pad 353 of the electronic device 300 in this embodiment are not completely covered by the ohmic contact electrode 361, the ohmic contact electrode 362 and/or the ohmic contact electrode 363, respectively. When viewed along a side direction (e.g. the X direction and/or the Y direction), the ohmic contact electrode 361, the ohmic contact electrode 362 and/or the ohmic contact electrode 363 are exposed from the conductive pad 351, the conductive pad 352 and the conductive pad 353, respectively. In this embodiment, the light-emitting efficiency of the third light-emitting element 340 is greater than the light-emitting efficiency of the second light-emitting element 330, the light-emitting efficiency of the second light-emitting element 330 is greater than the light-emitting efficiency of the first light-emitting element 320. Therefore, the area of the ohmic contact electrode 363 connected to the third light-emitting element 340 on the X-Y plane (contact with the semiconductor layer 341) is larger than the area of the ohmic contact electrode 362 connected to the second light-emitting element 330 on the X-Y plane (contact with the semiconductor layer 331), and the area of the ohmic contact electrode 363 connected to the third light-emitting element 340 on the X-Y plane is even larger than the area of the ohmic contact electrode 361 connected to the first light-emitting element 320 on the X-Y plane (contact with the semiconductor layer 321).

In addition, in this embodiment, the area of the conductive pad 351 on the X-Y plane is larger than the area of the ohmic contact electrode 361 on the X-Y plane. The area of the conductive pad 352 on the X-Y plane is substantially equal to the area of the ohmic contact electrode 362 on the X-Y plane. The area of the conductive pad 353 on the X-Y plane is smaller than the area of the ohmic contact electrode 363 on the X-Y plane. The present disclosure is not limited thereto. Those skilled in the art may arbitrarily adjust the area relationship between the conductive pad 351 and the ohmic contact electrode 361, between the conductive pad 352 and the ohmic contact electrode 362, or between the conductive pad 353 and the ohmic contact electrode 363 as required. Similarly, the area relationship between the conductive pad and the ohmic contact electrode described above may also adopt any combination of the conductive pad and the ohmic contact electrode described in the present disclosure, and it will not be described in detail below.

Figure 6:
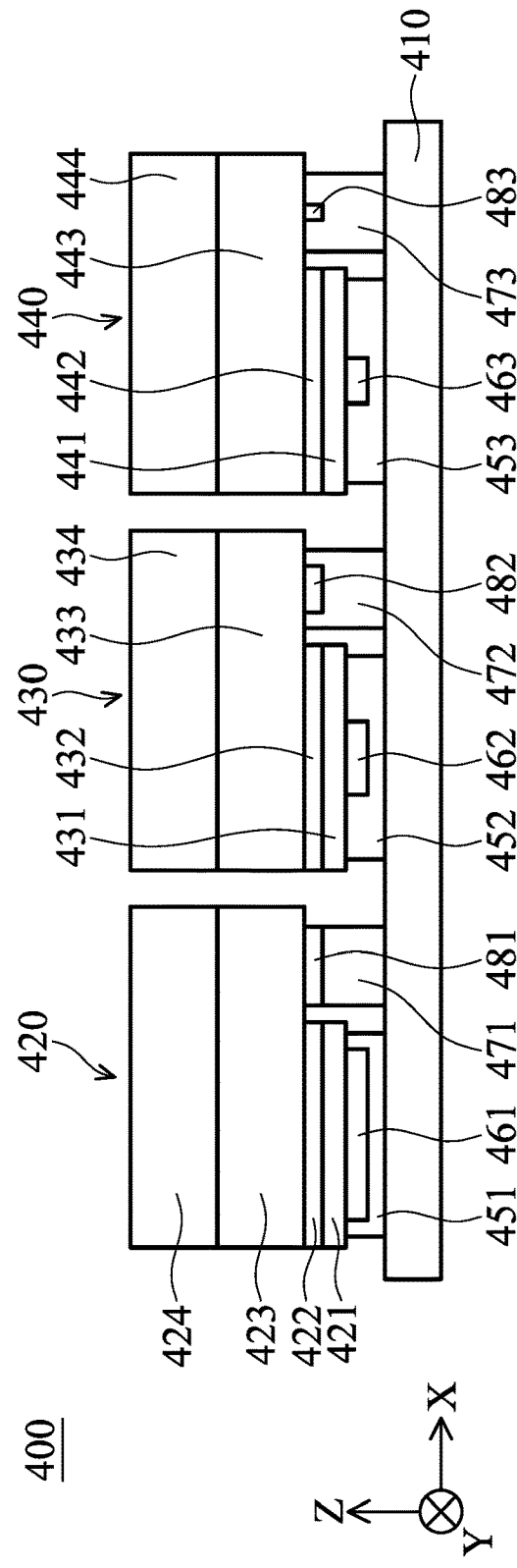
FIG. 6 is a cross-sectional view illustrating the electronic device in accordance with some embodiments of the present disclosure.

FIG. 6 is a cross-sectional view illustrating the electronic device in accordance with some embodiments of the present disclosure. It should be noted that the electronic device 400 in this embodiment may include the same or similar parts as the electronic device 100 shown in FIGS. 1 and 2, and the aforementioned same or similar parts will be labeled with similar numerals. These parts will not be described in detail again. For example, the electronic device 400 includes a substrate 410 and a first light-emitting element 420, a second light-emitting element 430 and a third light-emitting element 440 that are disposed on the substrate 410. Semiconductor layers 421, 431 and 441 of the light-emitting elements are each connected to the substrate 410 via ohmic contact electrodes 461, 462, 463 and/or conductive pads 451, 452, 453. In addition, Semiconductor layers 423, 433, and 443 of the light-emitting elements are connected to the substrate 410 via ohmic contact electrodes 481, 482, 483 and/or conductive pads 471, 472, 473, respectively.

The first light-emitting element 420 of the electronic device 400 in this embodiment includes an ultraviolet LED, and a color conversion layer 424 can be disposed on the semiconductor layer 423 of the first light-emitting element 420. The light emitted by the light-emitting layer 422 is converted into blue light and irradiated to the outside. Similarly, the second light-emitting element 430 and the third light-emitting element 440 may include ultraviolet LEDs, and the second light-emitting element 430 and the third light-emitting element 440 are provided with a color conversion layer 434 and a color conversion layer 444, respectively. The light emitted from the light-emitting layer 432 and the light-emitting layer 442 is converted into green light or red light and irradiated to the outside. In addition, in this embodiment, the sizes of the ohmic contact electrode 481, the ohmic contact electrode 482 and the ohmic contact electrode 483 on the X-Y plane are not uniform. As shown in FIG. 6, the ohmic contact electrode 481, the ohmic contact electrode 482 and the ohmic contact electrode 483 may have an area relationship similar to that of the ohmic contact electrode 461, the ohmic contact electrode 462 and the ohmic contact electrode 463. That is, on the X-Y plane, the area of the ohmic contact electrode 481 is larger than the area of the ohmic contact electrode 482, the area of the ohmic contact electrode 482 is larger than the area of the ohmic contact electrode 483, but the present disclosure is not limited thereto.

Figure 7:
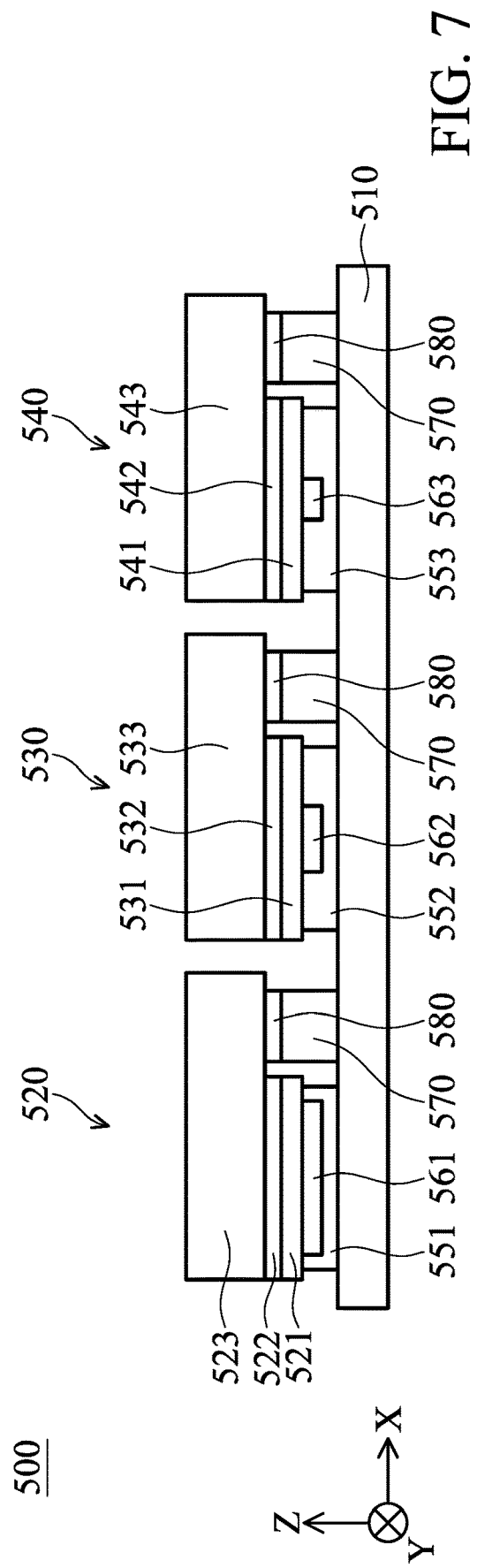
FIG. 7 is a cross-sectional view illustrating the electronic device in accordance with some embodiments of the present disclosure.

FIG. 7 is a cross-sectional view illustrating the electronic device in accordance with some embodiments of the present disclosure. It should be noted that the electronic device 500 in this embodiment may include the same or similar parts as the electronic device 100 shown in FIG. 1 and FIG. 2. The same or similar parts will be denoted by similar numerals, and will not be described in detail again. For example, the electronic device 500 includes a substrate 510 and a first light-emitting element 520, a second light-emitting element 530 and a third light-emitting element 540 that are disposed on the substrate 510. Semiconductor layers 521, 531 and 541 of the light-emitting elements are each connected to the substrate 510 via ohmic contact electrodes 561, 562, 563 and conductive pads 551, 552, 553.

In this embodiment, the first light-emitting element 520 of the electronic device 500 includes a blue LED, the second light-emitting element 530 includes a green LED, and the third light-emitting element 540 includes a red LED. For example, the semiconductor layer 531 and the semiconductor layer 533 of the second light-emitting element 530 include gallium nitride or any other suitable semiconductor material, but they are not limited thereto. The semiconductor layer 541 and the semiconductor layer 543 of the third light-emitting element 540 include aluminum gallium indium phosphide (AlGaInP) or any other suitable semiconductor material, but they are not limited thereto. Since the above light-emitting elements may directly emit blue, green or red light, it is not necessary to provide a light-transmitting layer and/or a color conversion layer in this embodiment, and thereby simplifying the manufacturing process of the electronic device 500.

Figure 8:
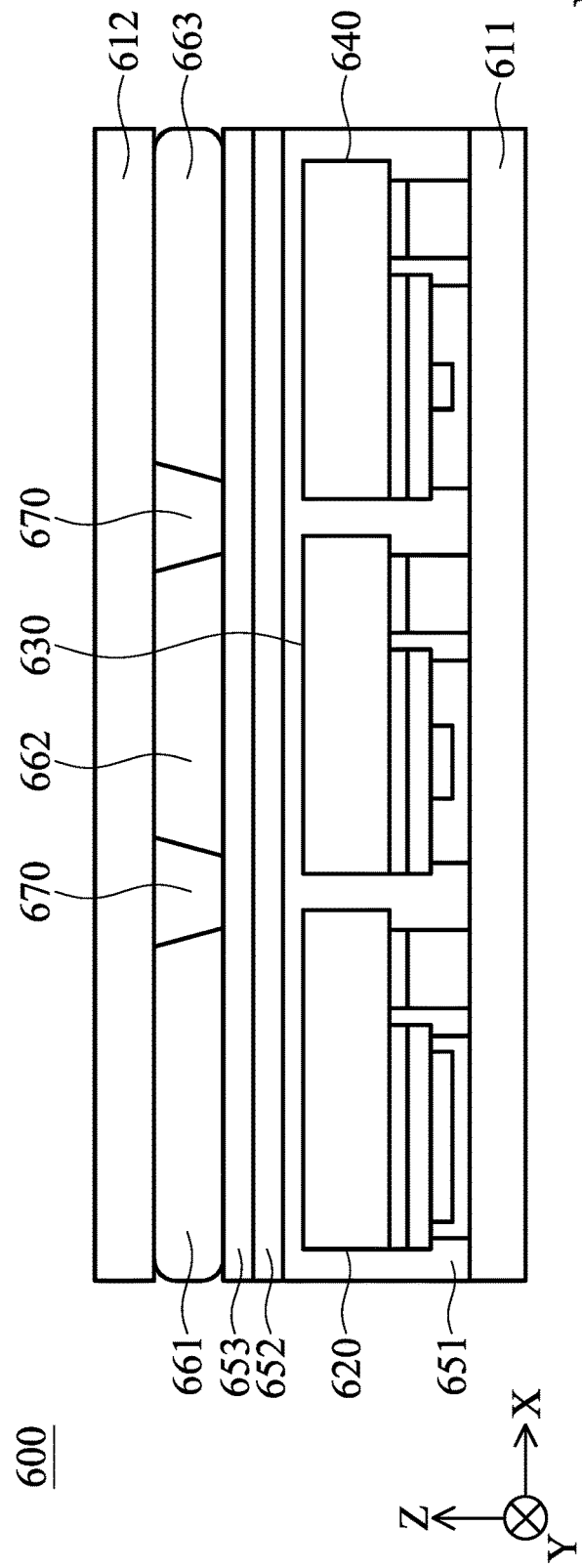
FIG. 8 is a cross-sectional view illustrating the electronic device in accordance with some embodiments of the present disclosure.

FIG. 8 is a cross-sectional view illustrating the electronic device in accordance with some embodiments of the present disclosure. It should be noted that the electronic device 600 may include the same or similar parts as the electronic device 100 shown in FIG. 1 and FIG. 2. The same or similar parts will be labeled with similar numerals, and will not be described in detail again. For example, the electronic device 600 includes a substrate 611 and a first light-emitting element 620, a second light-emitting element 630, a third light-emitting element 640 that are disposed on the substrate 611. The first light-emitting element 620, the second light-emitting element 630 and the third light-emitting element 640 of the electronic device 600 in this embodiment may be covered by the protective layer 651 to reduce the chance that the light-emitting elements are damaged due to external force.

In addition, the electronic device 600 further includes a substrate 612 disposed opposite to the substrate 611. On the substrate 612, a light-transmitting layer 661 is disposed corresponding to the first light-emitting element 620, a color conversion layer 662 is disposed corresponding to the second light-emitting element 630, and a color conversion layer 663 is disposed corresponding to the third light-emitting element 640. In this embodiment, a light-shielding layer 670 is disposed between the light-transmitting layer 661 and the color conversion layer 662, and between the color conversion layer 662 and the color conversion layer 663 to reduce the mixing of light from different light-emitting units with each other, which may affect the performance of the electronic device 600. A protective layer 653 is disposed under the light-transmitting layer 661, the color conversion layer 662, the color conversion layer 663 and the light-shielding layer 670 for reducing the damage of the layers due to external forces. The protective layer 651 and the protective layer 653 may be bonded via the adhesive layer 652, and therefore bonding the substrate 612 to the substrate 611.

Figure 9:
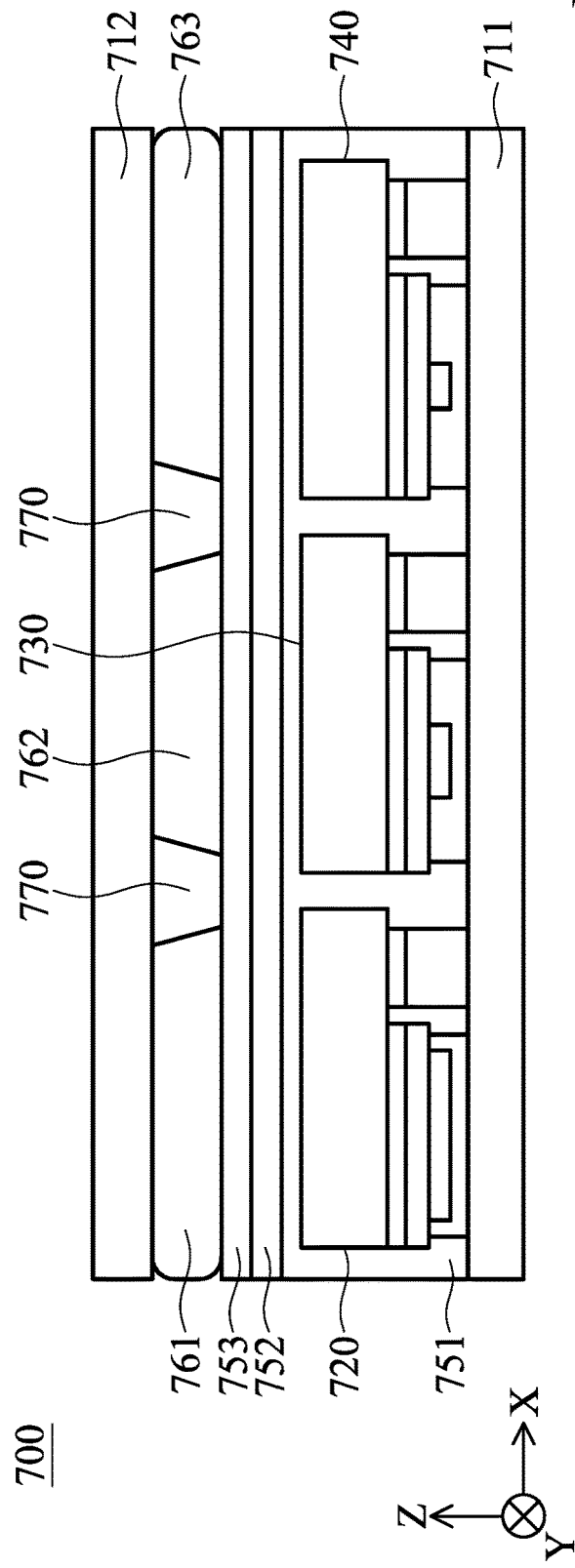
FIG. 9 is a cross-sectional view illustrating the electronic device in accordance with some embodiments of the present disclosure.

FIG. 9 is a cross-sectional view illustrating the electronic device in accordance with some embodiments of the present disclosure. It should be noted that the electronic device 700 in this embodiment may include the same or similar parts as the electronic device 600 shown in FIG. 6, and the aforementioned same or similar parts will be labeled with similar numerals and will not be described in detail again. For example, the electronic device 700 includes a substrate 711 and a substrate 712 that are opposite to each other. A first light-emitting element 720, a second light-emitting element 730 and a third light-emitting element 740 are disposed on the substrate 711. A color conversion layer 761, a color conversion layer 762, a color conversion layer 763 and a light shielding layer 770 are disposed on the substrate 712.

In this embodiment, the first light-emitting element 720 of the electronic device 700 includes an ultraviolet LED. Therefore, a corresponding color conversion layer 761 can be disposed on the first light-emitting element 720, the light emitted by the first light-emitting element 720 is converted into blue light and irradiated to the outside. Similarly, the second light-emitting element 730 and the third light-emitting element 740 may include ultraviolet LEDs, the second light-emitting element 730 and the third light-emitting element 740 may be provided with corresponding color conversion layers 762 and 763 to convert the emitted light to green light or red light. It should be understood that, for the sake of brevity, the size relationship between different ohmic contact electrodes is not specifically described in the embodiments shown in FIG. 8 and FIG. 9, but those skilled in the art may appropriately arrange the ohmic contact electrodes based on other embodiments in the present disclosure.

Figure 10:
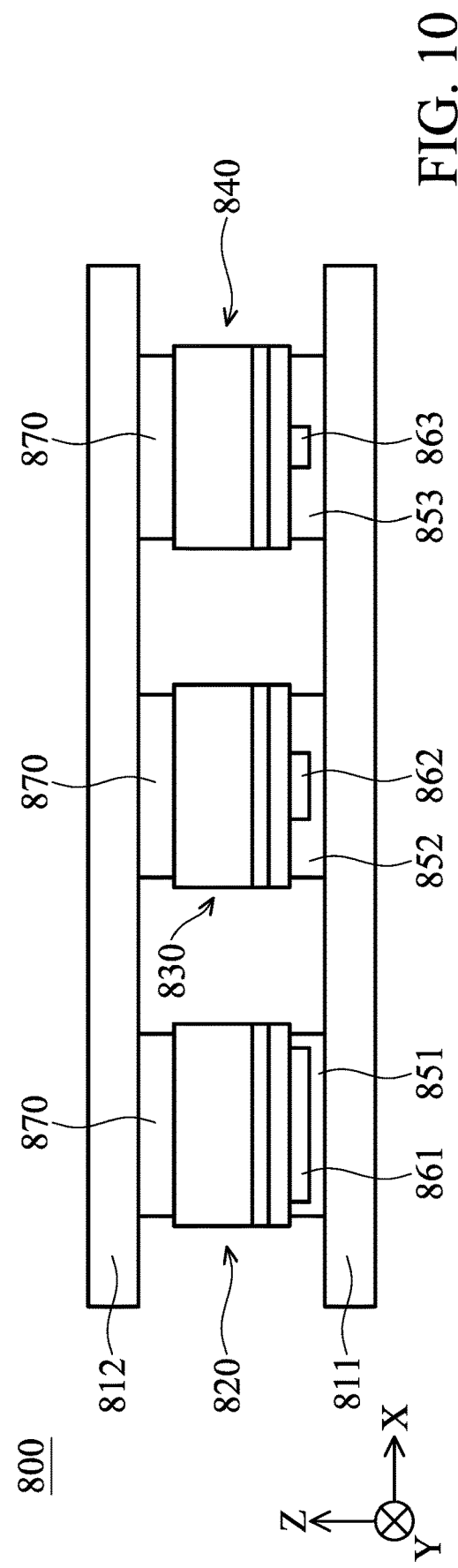
FIG. 10 is a cross-sectional view illustrating the electronic device in accordance with some embodiments of the present disclosure.

FIG. 10 is a cross-sectional view illustrating the electronic device in accordance with some embodiments of the present disclosure. It should be noted that the electronic device 800 in this embodiment may include the same or similar parts as the electronic device 100 shown in FIGS. 1 and 2. The aforementioned same or similar parts will be labeled with similar numerals and will not be described in detail again. For example, the electronic device 800 includes a substrate 811 and a first light-emitting element 820, a second light-emitting element 830, a third light-emitting element 840 that are disposed on the substrate 811, and the foregoing light-emitting elements are each connected to the substrate 811 via ohmic contact electrodes 861, 862, 863 and conductive pads 851, 852, 853.

The electronic device 800 in this embodiment further includes a substrate 812, disposed opposite to the substrate 811. In the present embodiment, the first light-emitting element 820, the second light-emitting element 830 and the third light-emitting element 840 are connected to the substrate 812 via conductive pads 870. The substrate 812 may protect the first light-emitting element 820, the second light-emitting element 830 and the third light-emitting element 840.

Figure 11:
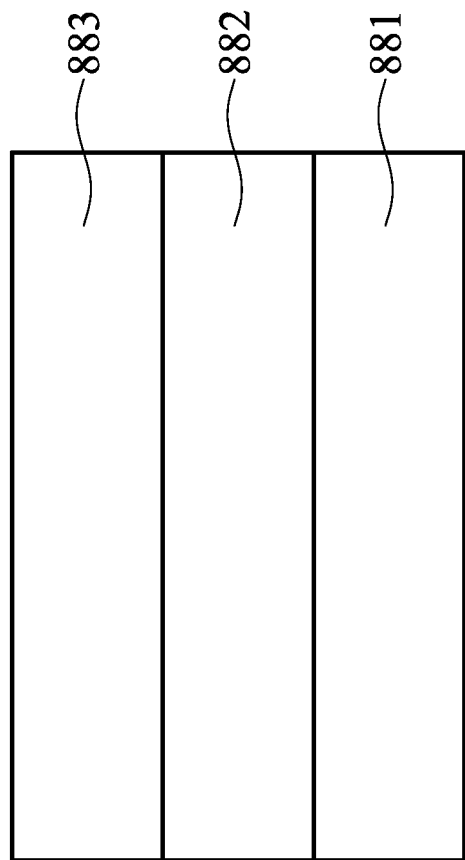
FIG. 11 is a cross-sectional view illustrating a conductive pad in accordance with some embodiments of the present disclosure.

FIG. 11 is a cross-sectional view illustrating a conductive pad 880 in accordance with some embodiments of the present disclosure. As shown in FIG. 11, the conductive pad 880 includes a bonding layer 881, a barrier layer 882 and an adhesive layer 883 sequentially stacked. In some embodiments, the bonding layer 881 is disposed on the substrate. The barrier layer 882 is disposed on the bonding layer 881. The adhesive layer 883 is disposed on the barrier layer 882 and is in contact with the ohmic contact electrode. For example, the bonding layer 881 may include copper (Cu), gold (Au), silver (Ag), tin (Sn), indium (In), other suitable metal materials or a combination thereof, but it is not limited thereto. The barrier layer 882 may include nickel (Ni), platinum (Pt), other suitable metal materials or a combination thereof, but it is not limited thereto. The adhesive layer 883 may include chromium (Cr), titanium (Ti), other suitable metal materials or a combination thereof, but it is not limited thereto. It should be understood that the conductive pad 880 in this embodiment can be applied to the conductive pads in all the above embodiments, but it is not limited thereto.

Figure 12:
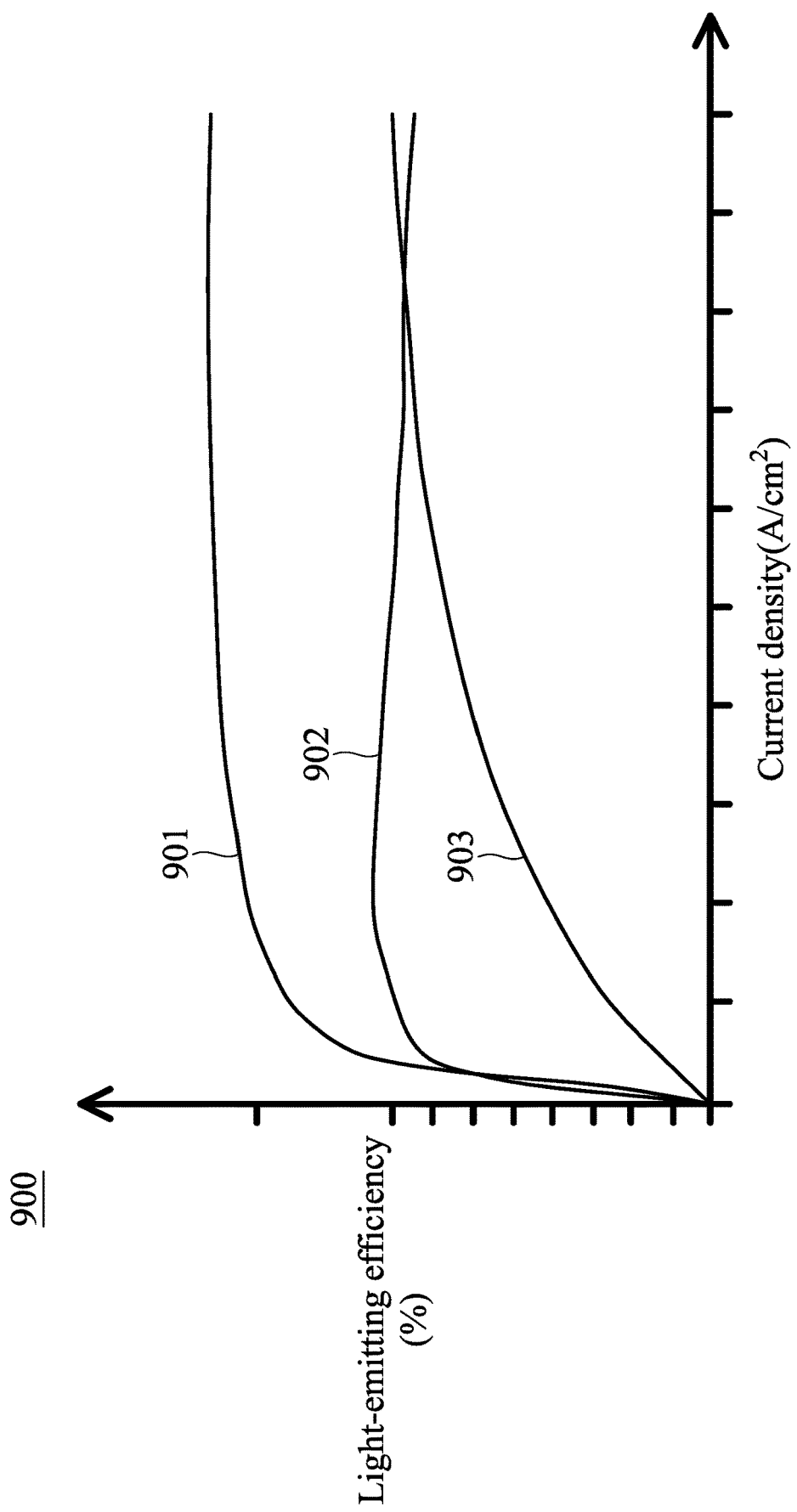
FIG. 12 is a schematic diagram illustrating the relationship between the light-emitting efficiency and the current density in accordance with some other embodiments of the present disclosure.

FIG. 12 is a schematic diagram illustrating the relationship between the light-emitting efficiency and the current density in accordance with some other embodiments of the present disclosure. As shown in FIG. 12, a graph 900 shows lines 901, 902 and 903. The line 901 may include blue light, the line 902 may include green light, the line 903 may include red light, but they are not limited thereto. The lines 901, 902 and 903 each indicate the relationship between the light-emitting efficiency and the current density of different light-emitting elements. The vertical axis of the graph 900 indicates the light-emitting efficiency (%), and the horizontal axis indicates the current density ($A/cm^2$). In order to make the light-emitting efficiency of each light-emitting element uniform, the current density required for each light-emitting element to reach the target light-emitting efficiency can be obtained from graph 900. Then, the size of the ohmic contact electrode may be adjusted according to the current density value shown in the graph 900. It should be understood that the relationship between the light-emitting efficiency and the current density shown in the graph 900 merely serves as an example. The present disclosure is not limited thereto. In other embodiments, the relationship between the light-emitting efficiency and the current density of the light-emitting element may be different from the relationship shown by the lines 901, 902 and 903.

As set forth above, some embodiments of the present disclosure provide an electronic device having ohmic contact electrodes with different sizes. The sizes of the ohmic contact electrodes may be adjusted, such that the light-emitting efficiencies of the light-emitting elements tend to be uniform. As a result, white color balance may be achieved without the complicated manufacturing process for the light-emitting elements.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments in the present disclosure may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An electronic device, comprising:
   a substrate;
   another substrate disposed opposite to the substrate;
   a first light-emitting element disposed on the substrate and configured to emit blue light under a first current density when the substrate provides a first current to the first light-emitting element, wherein the first light-emitting element comprises a first semiconductor layer, a first ohmic contact electrode and a first conductive pad;
   a second light-emitting element disposed on the substrate and configured to emit green light or red light under a second current density when the substrate provides a second current to the second light-emitting element, wherein the second light-emitting element comprises a second ohmic contact electrode and a second conductive pad disposed between the substrate and the second ohmic contact electrode;
   a protective layer disposed between the substrate and the another substrate, and covering the first light-emitting element and the second light-emitting element;
   an adhesive layer disposed between the protective layer and the another substrate; and
   a light-shielding layer disposed over the protective layer and the adhesive layer, wherein when viewed in a direction perpendicular to an upper surface of the substrate, the light-shielding layer is partially overlapped with the first light-emitting element and the second light-emitting element,
   wherein the first current is equal to the second current, and the first current density is less than the second current density,
   wherein the second ohmic contact electrode is divided into a plurality of separate portions, and the second conductive pad is in contact with sidewalls of the plurality of separate portions.

2. The electronic device as claimed in claim 1, wherein the first current density is defined by a ratio of the first current to an area of the first ohmic contact electrode.

3. The electronic device as claimed in claim 2, wherein the second current density is defined by a ratio of the second current to an area of the second ohmic contact electrode.

4. The electronic device as claimed in claim 3, wherein the area of the first ohmic contact electrode is different from the area of the second ohmic contact electrode.

5. The electronic device as claimed in claim 1, further comprising a third light-emitting element disposed on the substrate,
   wherein when the second light-emitting element emits green light, the third light-emitting element is configured to emit red light under a third current density when the substrate provides a third current to the third light-emitting element, wherein the third current is equal to the first current, and the third current density is different from the first current density and the second current density.

6. The electronic device as claimed in claim 5, wherein the third light-emitting element comprises a third ohmic contact electrode, and the third current density is defined by a ratio of the third current to an area of the third ohmic contact electrode.

7. The electronic device as claimed in claim 6, wherein the area of the first ohmic contact electrode is different from the area of the third ohmic contact electrode.

* * * * *